United States Patent [19]

Sloane

[11] 4,419,656
[45] Dec. 6, 1983

[54] METHOD AND APPARATUS FOR DIGITAL CONVERTER TESTING

[75] Inventor: Edwin A. Sloane, Los Altos, Calif.

[73] Assignee: Fairchild Camera & Instrument Corp., Mountain View, Calif.

[21] Appl. No.: 204,979

[22] Filed: Nov. 7, 1980

[51] Int. Cl.³ .......................................... H03K 13/02
[52] U.S. Cl. ...................... 340/347 CC; 340/347 AD; 340/347 DA; 371/25
[58] Field of Search .................. 371/25; 340/347 AD, 340/347 DA, 347 CC; 374/130, 99 D

[56] References Cited

PUBLICATIONS

L. F. Pau, "Fast Testing and Trimming of A/D and D/A Converters in Automatic Test Systems", published in the *Proceedings of Autotestcon '78*, IEEE Catalog 78 CH 1416-7, Nov. 1978, pp. 268-274.
Sellier, "IBM Technical Disclosure Bulletin", vol. 22, No. 3, Aug. 1979, pp. 1039-1040.

*Primary Examiner*—C. D. Miller
*Attorney, Agent, or Firm*—Kenneth Olsen; Theodore Scott Park; Kenneth R. Allen

[57] ABSTRACT

A method and apparatus is described for dynamically testing the overall performance characteristics of digital-to-analog converts and analog-to digital converters which involve excitation of the converters by an orthogonal function signal. Specifically the method comprises dynamically exercising a converter with an analog or digital signal pattern characterized by the sum of a set of mutually orthogonal functions, the sum having substantially uniform amplitude distribution among allowable states (maximum entropy), and simultaneously examining the output response of the converter for a plurality of basic performance parameters. The basic performance parameters typically include distortion, linearity and optimum gain. The simultaneous examination involves sorting out expected responses to simultaneously applied orthogonal signals. The method yields a relatively complete statistical description of the performance characteristics. The preferred excitation is based on the Walsh functions. The output response is readily analyzed by Fast Walsh Transform processors.

20 Claims, 3 Drawing Figures

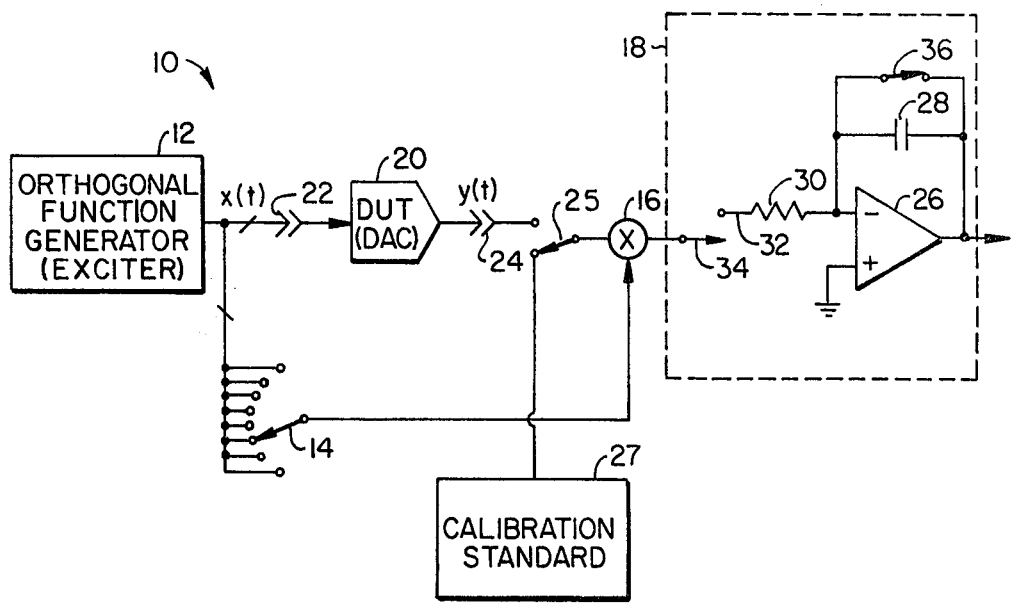
FIG._1.
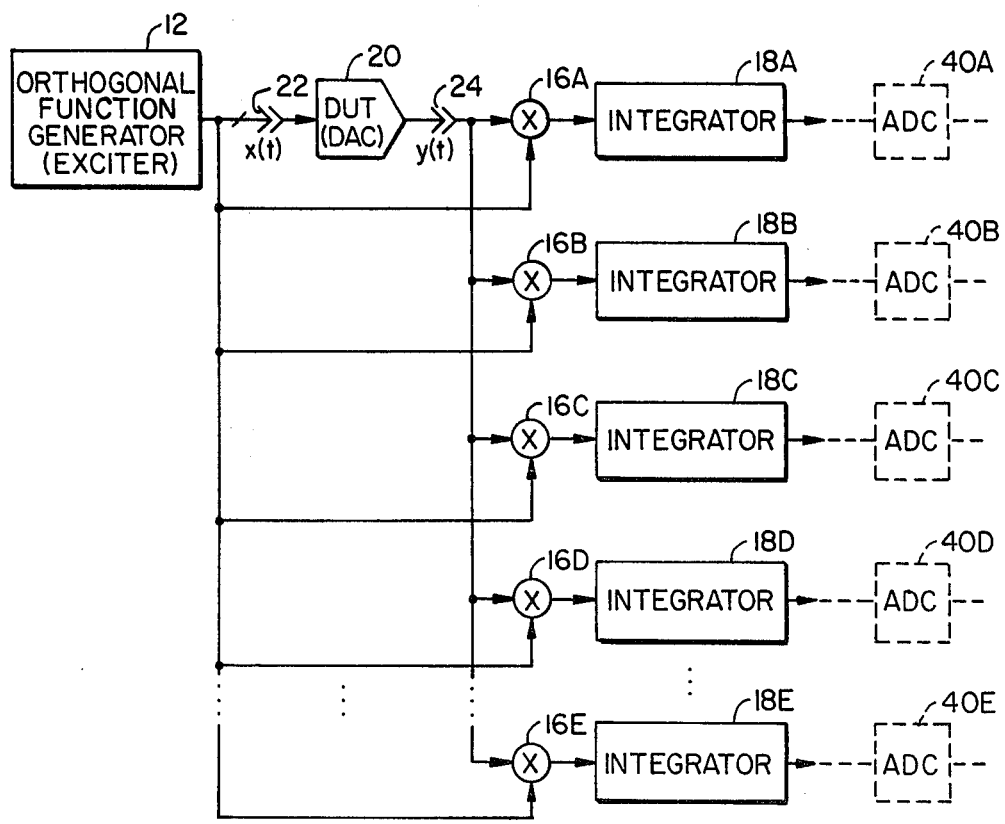
FIG._2.

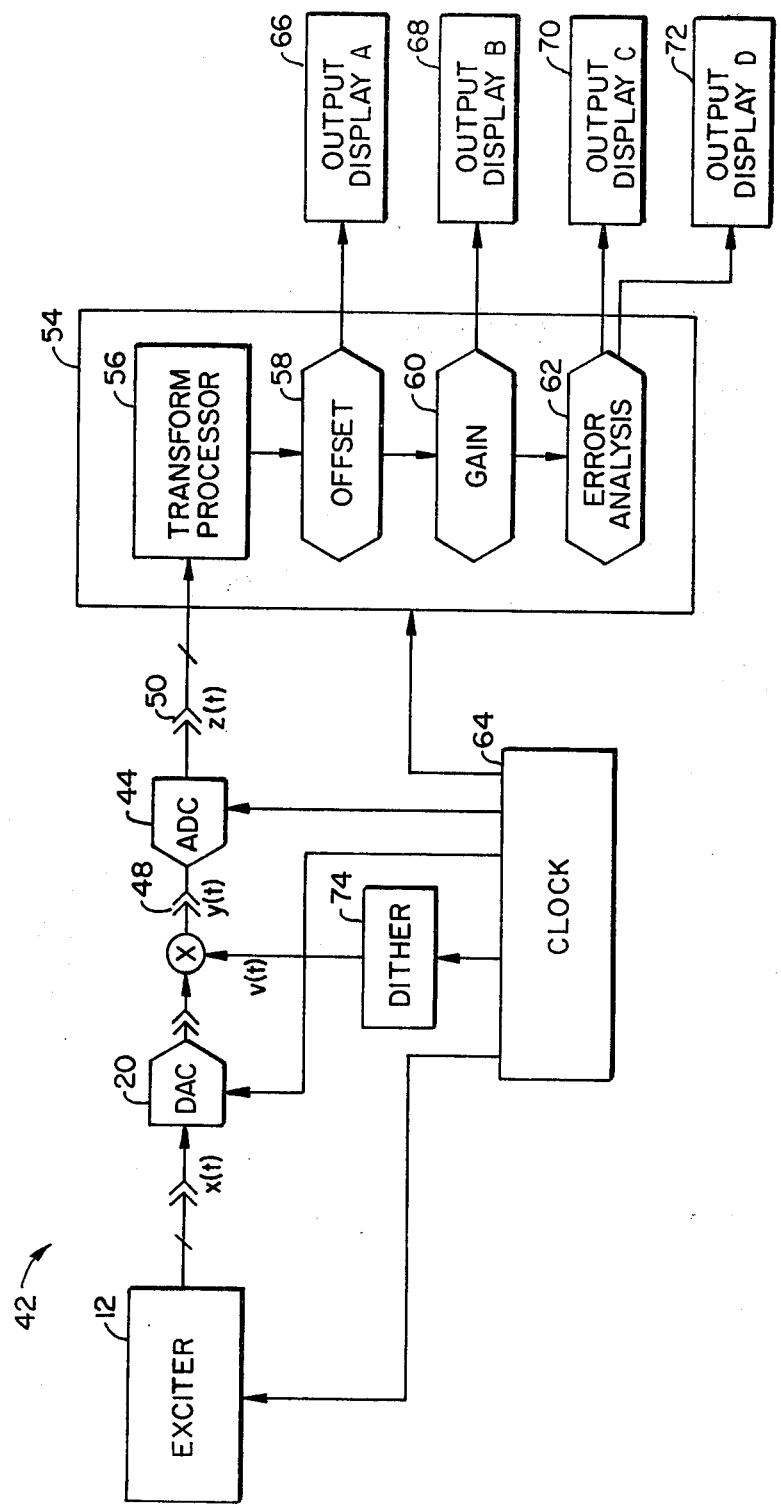
FIG._3.

METHOD AND APPARATUS FOR DIGITAL CONVERTER TESTING

BACKGROUND OF THE INVENTION

1. Field of Invention

This invention relates to automatic test systems for digital electronic converters and particularly to methods and apparatus for testing analog-to-digital converters and digital-to-analog converters.

Converters between the digital and analog domains are employed to interface digital electonic circuitry and devices producing analog signals. Accuracy of conversion, gain and repeatability in the process of conversion are characteristics which are important to evaluate, and if possible, characteristics for which an optimized calibration procedure is desireable.

2. Description of the Prior Art

Current state of the art testing techniques for converters are generally limited to testing a few states, such as major transitions for analog-to-digital converters and such as the simple binary weights and full-scale amplitude for digital-to-analog converters. Substantially all tests are static in nature and are incapable of providing a complete statistical evaluation of the converter.

Dynamic testing techniques have been suggested for limited purposes. An example is a method proposed by L. F. Pau and presented in a paper entitled "Fast Testing and Trimming of A/D and D/A Converters in Automatic Test Systems" at the 1978 IEEE Autotest Conference. Pau has suggested one method of dynamic testing employing excitation signals characterized by Walsh functions. The evaluation method presupposes the use of an ideal reference device, the output response of which is employed with the output response of a device under test to generate an error signal from which optimization decisions are made. A device built according to the techniques suggested by Pau is therefore limited by the accuracy of the referenced device.

SUMMARY OF THE INVENTION

According to the invention, a method and apparatus is provided for dynamically testing the overall performance characteristics of digital-to-analog converters and analog-to-digital converters. The method comprises dynamically exercising a converter with analog or digital signal patterns characterized by the sum of a set of mutually orthogonal functions, the sum having substantially uniform amplitude distributions over the allowable states of the amplitude range in order to exercise substantially all allowable converter states. Thereafter, the response of the converter under test is examined for a plurality of basic performance parameters, including total distortion, linearity and optimum gain. Each state of the converter can be simultaneously examined by sorting out expected responses to a signal composed of simultaneously applied orthogonal functions. The method yields a relatively complete statistical description of the performance characteristics.

In a preferred method for testing a digital-to-analog converter, the preferred excitation pattern is a set of mutually orthogonal bit pattern sequences based on the Walsh functions, the pattern being substantially uniformly distributed over the amplitude range. Each one of the Walsh functions is binary weighted, or weighted by the power of two, determined by the order of the function, since each Walsh function is applied to a selected bit input of the converter. A suitable substantially uniform amplitude distribution is achieved by ordering the orthogonal function set to synthesize a ramp function; i.e., a sampled staircase function.

BRIEF DESCRIPTION OF THE DRAWINGS

FIG. 1 is a first embodiment of the invention for testing or calibrating digital-to-analog converters.

FIG. 2 is a second embodiment of the invention for calibrating or testing digital-to-analog converters.

FIG. 3 is a third embodiment of the invention for calibrating analog-to-digital converters.

DETAILED DESCRIPTION OF SPECIFIC EMBODIMENTS

According to the invention a converter under test is exercised with a specific signal pattern to produce a response from which basic performance parameters can be extracted simultaneously, such as total distortion, linearity, optimum gain, offset and the like. The testing technique is capable of generating, in real time, a statistically complete description of a device under test (DUT), either an analog-to-digital converter or a digital-to-analog converter.

Underlying the successful realization of the invention is the application of the theory of orthogonal functions, and more particularly, the application of a specific set of orthogonal functions, two state orthogonal functions, the Walsh functions or the sum of specific Walsh functions such as the modified Walsh functions, as a test signal for a device to be tested. The successful realization of simultaneous evaluation of several response parameters is based on the mutual orthogonality of simultaneously applied functions, each of which is distinctly weighted and simultaneously applied to form an excitation signal. Simultaneous evaluation of several response parameters is possible through fast transform techniques, especially Fast Walsh Transforms. Finally, the extraction of a reliable set of response parameters is based on the recognition that the excitation signal should be of a class of signals or bit patterns known as maximum entropy functions or signals. By maximum entropy, it is meant that all possible states or values of the excitation signal have an equal probability of occurrence in the time frame of interest. In other words, a maximum entropy signal has maximum uncertainty and substantially uniform amplitude probability distribution. A simple continuous liner ramp function or a sampled staircase function are examples of excitation signals in this class. Another example would be a time-scrambled discontinuous function assuming all the sampled values of a continuous ramp function during the same time period as a ramp function. Modified Walsh functions, which are a sum of Walsh functions and thus not mutually orthogonal, may also be used in circumstances where certain criteria are satisfied. A synthesized signal which is a suitable substitute for a Walsh function excitation for a digital sequence should satisfy the following conditions:

"Given a set of distinct non-zero order Walsh functions, each with distinct binary weights, if the modulo-two sum of their binary Walsh number is not zero and if the sequency numbers (i.e., number of state transitions) generate a logical true for all bits when "OR'd" bit by bit, then the sum of the binary weighted functions will be a maximum entropy sequency."

Because this sum is the sum of orthogonal functions, there can be simultaneous evaluation of a plurality of bits which are excited by modified Walsh functions.

Since the integrated product of orthogonal functions of differing order is by definition zero, and is non-zero if of the same order, orthogonal function excitation, by its nature, allows the response to any one function in a group of simultaneously applied functions in an excitation signal to be isolated for analysis. Hence, in testing a digital-to-analog converter, a single bit pattern comprising a plurality of orthogonal bit patterns may be applied to the inputs so that the precise contribution of each bit pattern to the total output can be statistically determined by multiplication and integration of orthogonal functions of the same order (i.e., correlation of orthogonal functions of the same order).

Turning to FIG. 1, there is shown a block diagram of a basic embodiment of a digitial-to-analog converter (DAC) test system 10 for testing a DAC or for calibrating a DAC for use in other tests. The DAC test system 10 comprises an orthogonal function generator or exciter 12, a selector switch 14, a multiplier 16, and an integrater 18. The device to be tested or device under test (DUT) 20 is a DAC coupled between a digital output terminal plug 22 and a single line analog input terminal 24. The exciter 12 has a digital output bus coupled to the output terminal plug 22 and to the selector switch 14. The selector switch 14 couples one bit line of the output bus to the input of multiplier 16. In the case of a two stage or Walsh function generator, the multiplier 16 may be a simple two-state (positive/negative) multiplier of an analog signal applied through analog input terminal 24. A calibration switch 25 is preferably provided between the analog input terminal 24 and the multiplier 16 to allow connection of a calibration standard 27 to the input of the integrator 18. The calibration standard 27 may be a known fixed voltage within the intended amplitude range of the DUT 20. By applying a known fixed voltage to the input of the integrator 18 for a known time period and examining the response, the integrator 18 is calibrated.

The integrator 18 comprises an operational amplifier 26 having an integrating capacitor 28 between the inverting input and the output, a timing resistor 30 in the inverting input feed line 32, and two integration switches, namely, a normally open input switch 34 in the inverting feed line 32 and a normally closed integration switch 36 across the capacitor 28. As will be recognized by those skilled in the art, an integration of the input signal will be performed whenever switch 36 is opened while switch 34 is closed. The exciter 12, DUT 20, selector switch 14 and integration switches 34 and 36 are operated off of a common master clock to insure synchronous and accurate integration for the period of the converter test. It should also be recognized that the device under test 20 is capable of latching its level of output for a period corresponding to a conversion interval. Any set of orthogonal functions can be employed in the invention. However, two state orthogonal functions work particularly well in digital systems. The Walsh functions are a well-defined example of a set of suitable orthogonal functions. Hence, the specific examples which follow therefore refer to the Walsh functions for purposes of illustration and not limitaion.

A typical test sequence according to the invention is as follows: The exciter 12 applies an orthogonal set of bit patterns as a single signal, namely, a set of Walsh function bit patterns each of which has an implicit binary weight of $2^m$, where each m corresponds to the order of the bit to which the Walsh function is connected by means of the bus connected to output terminal 22 to the DUT 20 and also to the selector switch 14. This excitation pattern is designated x(t). The DUT 20 produces an output response which is designated y(t). The excitation pattern x(t) is characterized by the following summation:

$$x(t) = \sum_{m=0}^{M-1} 2^m \phi_{k,m}(t)$$

where $\phi_{k,m}(t)$ is the modified Walsh function generated by the exciter by Walsh functions of order k, m is the index, and M is the number of bits of the converter associated with the $m^{th}$ bit.

The output of the DUT 20 y(t) is characterized by the following summation:

$$y(t) = \sum_{n=0}^{2^M-1} a_n \Psi_n(t)$$

where $a_n$ is the coefficient of the $n^{th}$ order Walsh function and $\Psi_n(t)$ is the $n^{th}$ order Walsh function.

It should be noted that the modified Walsh function generated by the exciter is by definition:

$$\phi_m(t) = \tfrac{1}{2}(\Psi_m(t) + \Psi_o(t))$$

which assumes only values of +1 or 0. The modifed Walsh functions are not an orthogonal set since they are offset to have a non-zero mean.

The selector switch 14 in FIG. 1 is operative to isolate one digital line and to apply the orthogonal function signal on that digital line to the multiplier 16. The product of the multiplier 16 will be the response of the DUT 20 to the excitation of the selected digital bit line since the output is the product of orthogonal signals of the same order. The multiplier 16 output is then integrated by the integrater 18 through the network of the op-amp 26, resistor 30 and capacitor 28 whenever the switch 36 is open.

If the integrator 18 is cleared by momentarily closing switch 36, if the switch 34 is closed to apply the output response of the DUT 20 to the multiplier 16, and if the multiplier is switched by a Walsh function or modified Walsh function through the selector switch 14, then the integrator output at the end of the test period, T, will be as follows:

$$\frac{a_{k,m}}{2} = \frac{1}{T} \int_T y(t) \Psi_{k,m}(t) dt$$

$$= \frac{1}{T} \sum_{n=0}^{2^M-1} a_n \int_T \Phi_n(t) \Psi_{k,m}(t) dt$$

if the order of the modified Walsh function is the same as the order of the Walsh function.

The above expression represents the value at the output of the integrator 18 at the end of the test sequence and represents an estimate of the dynamic weight of the $m^{th}$ bit of the digital-to-analog converter. In this manner each bit of the digital-to-analog converter under test can be characterized by a single value representing the dynamic weight of that bit. The set of actual values can thereafter be used to define a calibration transfer characteristic for linearity and offset as discussed more fully hereinafter. The mean offset error for the digital-to-analog converter may be obtained by examining the zeroeth order modified Walsh function and applying that criteria to the above formula as follows:

$$a_o = \frac{1}{T} \int T y(t) dt = \frac{1}{T} \sum_{n=0}^{2^M-1} a_n \int T \Psi_n(t) dt$$

where $\phi_k(t) = \phi_o(t)$.

Thus the zeroeth order coefficient of the Walsh function is the integrator output at the end of T seconds.

FIG. 2 illustrates an alternative embodiment of the test system of FIG. 1 in which all bits may be simultaneously examined. In the embodiment of FIG. 2, the function switch 14 of FIG. 1 has been omitted and a plurality of multipliers 16A, 16B, 16C, 16D and so forth through 16E have been introduced whereby each bit of the exciter can be examined simultaneously. Each multiplier 16a-e is coupled to receive the analog signal output of the DUT 20 and is also coupled to receive a digital signal of a selected one of the digital bit lines of the exciter 12. The output of each multiplier 16A-E is coupled to a corresponding integrator 18A, 18B, 18C, 18D and so forth through 18E. In this manner, the response of each bit of the DUT 20 can be uniquely defined as explained hereinabove with respect to a single bit. A DUT response so defined establishes a calibrated DAC which can be used for subsequent testing. It should also be noted that the characterization of the device under test and any related processing may be performed digitally through suitable conversion to digital signals through for example analog-to-digital converters 40A, 40B, 40C, 40D and so forth through 40E.

The output in digitized form is readily adapted for digital analysis by either Fast Fourier Transform techniques or by Fast Walsh Transform techniques. As has been noted, the invention is uniquely suited to the use of Walsh functions as the set of orthogonal excitation functions. The technique of Fast Walsh Transform analysis is directly analogous to Fast Fourier Transform analysis. Computations of Fast Walsh Transforms have been taught elsewhere, see for example J. L. Shank's, "Computations of the Fast-Walsh Transforms", IEEE Transactions on Computers, pp. 457-459, May 1969. Those of ordinary skill in the art who have familiarized themselves with this invention will readily be able to implement Fast Walsh Transform analysis techniques in the same manner that Fast Fourier Transform techniques are implemented. Accordingly, the Shanks disclosure is incorporated herein by reference and made a part hereof. Nevertheless, there may well be test processing apparatus implementing Fast Walsh Transform techniques which are not immediately apparent from the present disclosure.

FIG. 3 is a schematic diagram of a specific device for testing analog-to-digital converters. In FIG. 3, an analog-to-digital converter (ADC) test system 42 for an unknown ADC 44 comprises a Walsh function generator or the equivalent exciter 12 coupled to a calibrated or reference DAC 20, the analog output of which is coupled to an exciter terminal 48 of an ADC 44 (the DUT). The output of the ADC 44 is coupled through a test response terminal 50 to a signal processor 54. The signal processor 54 may be a device which implements selected signal analysis functions. These signal analysis functions could be a Fast Walsh Transform through a Walsh transform processor 56, an offset computer 58, a gain computer 60, and an error analysis computer 62. All devices function through synchronism with a master clock 64. The output signals of the signal processor 54 are provided to suitable display devices as for example output display A 66, output display B 68, output display C 70 and output display D 72.

A dither generator may be provided to the input signal applied to the ADC 44 through a small dither generator 74. The dither signal v(t) insures that any signal presented to the ADC 44 will have an amplitude distribution that is dense relative to the resolution of the analog-to-digital converter under test. Hence, the dither signal has an amplitude of generally less than one least significant bit and a driving function selected from the set of orthogonal functions which is a function not used to excite the DAC 20. A key element in the invention is the calibrated reference DAC 20, the calibration having been accomplished by the technique discussed hereinabove. The basic source of excitation is the signal x(t) which is a binary weighted set of M Walsh functions as previously discussed. The output signal applied to the ADC 44, y(t), is the sum of the reference DAC output and the dither signal (v(t)), from the dither generator 74, just as the output signal can be considered to be a sum of Walsh functions with real coefficients. Thus v(t) may be expressed as:

$$v(t) = \sum_{n=0}^{2^M-1} \beta_n \Psi_n(t)$$

and y(t) may be expressed as:

$$y(t) = \sum_{n=0}^{2^M-1} a_n \Psi_n(t) + v(t)$$

$$= \sum_{n=0}^{2^M-1} (a_n + \beta_n) \Psi_n(t)$$

The output z(t) of the ADC 44 excited by the function y(t) can also be characterized as a sum of Walsh functions where the coefficients account for the error introduced by the DAC as follows:

$$z(t) = a \sum_{n=0}^{2^M-1} \gamma_n \Psi_n(t)$$

$$= y(t) + \epsilon(t)$$

where $\epsilon(t)$ is the error introduced by the ADC;

$\gamma_n$ is the coefficient of the $n^{th}$ order Walsh function; and a is the gain of the ADC.

The coefficients of the $n^{th}$ order Walsh functions for y(t) are known by previous calculation. The coefficients of the $n^{th}$ order Walsh functions of the function z(t) can be determined ezperimentally. Hence, solving for the error produces the following result:

$$\epsilon(t) = z(t) - y(t)$$

$$= a \sum_{n=0}^{2^M-1} \gamma_n \Psi_n(t) - y(t)$$

-continued
$$= a \sum_{n=0}^{2^M-1} \gamma_n \Psi_n(t) - \sum_{n=0}^{2^M-1} (\alpha_n + \beta_n)\Psi_n(t)$$

Continuing with the analysis, the mean squared error for the ADC may be determined as follows:

$$\epsilon^2(t) = \frac{1}{T} \int_T (\epsilon(t))^2 dt$$

$$= \frac{a^2}{T} \int (\Sigma \gamma_n \Psi_n(t))^2 dt$$

$$+ \frac{1}{T} \int_T \eta^2(t) dt$$

$$- \frac{2a}{T} \int \eta(t) \sum_{n=0}^{2^M-1} \gamma_n \Psi_n(t) dt$$

The value of the optimum gain $a_{opt}$ that minimizes the mean square error may be obtained by setting to zero the first derivative with respect to the gain "a" and solving for "a" which by substitution becomes:

$$a_{opt} = \frac{\sum_{n=0}^{2^M-1} (\alpha_n + \beta_n)\gamma_n}{\sum_{n=0}^{2^M-1} \gamma_n^2}$$

The value for the optimum gain can therefore be computed by straightforward numerical computation techniques from the derived Walsh coefficients.

Linearity error can also be determined as follows: The binary weights of the modified Walsh functions due to the reference DAC outputs are first determined, the linearity error due to the reference DAC is determined and subtracted from each of the binary weights, and then the linearity function is compared with the excitation function, which is typically a maximum entropy function such as a ramp function wherein the contribution to observe linearity error due to the dither signal can be made negligible if synthesized from Walsh functions not used in the test pattern. The binary weights are defined as follows:

$$\lambda_{k,m} = \gamma_{k,m} - \beta_{k,m}$$

The ideal staircase or ramp function (i.e., uniformly quantized linear function) is expressed as follows:

$$r(t) = \sum_{m=0}^{M-1} 2^m \Phi_{2m}(t)$$

Thus, the linearity error is expressed as follows:

$$\epsilon_l = a_{opt} \sum_{m=0}^{M-1} \lambda_{k,m} \Phi_{2m}(t) - \epsilon'_l - r(t)$$

where $\epsilon'_l$ is the linearity error due to the reference DAC. which is by substitution:

$$\epsilon_l = \sum_{m=0}^{M-1} (a_{opt}\lambda_{k,m} - 2^m)\Phi_{2m}(t) - \epsilon'_l$$

The technique for generating the offset error in a tester according to the invention for analog-to-digital converters involves subtracting the known input offsets from the expected mean output level. The offset error, which should ideally be adjusted to zero initially is thus computed from the expression:

$$\bar{\epsilon} = a\gamma_0 - \frac{a}{2} \sum_{m=0}^{M-1} (\alpha_{k,m} + \beta_{k,m})2^m$$

The dither function v(t) is not essential and therefore the coefficient $\beta$ can be omitted without loss of generality.

One method by which a DAC could be tested according to the invention is to substitute a DAC to be tested in place of the reference DAC 20 in the devices disclosed in the embodiment of FIG. 3 where the ADC 44 has already been characterized by the methods outlined hereinabove. All computations are then referenced to the known response of the ADC to an expected input signal. Deviations from the expected signal define the coefficients by which the DAC under test can be calibrated.

The invention has now been described with reference to specific embodiments. Other embodiments within the scope of this invention will be obvious to those of ordinary skill in this art. Therefore, it is not intended that this invention be limited except as indicated by the appended claims.

What is claimed is:

1. A method for calibrating a digital-to-analog converter comprising the steps of:
generating a digital signal consisting of a set of orthogonal functions, each orthogonal function being binary weighted such that the synthesis of said digital signal is a substantially maximum entropy function;
applying said digital signal to the input of a digital-to-analog converter to be calibrated in order to produce an output response signal;
multiplying the output response signal by an orthogonal function; and
integrating the multiplied signal through a calibrated analog signal integrator for the duration of the orthogonal function duration to produce an estimate of the dynamic weight of each selected bit of the digital-to-analog converter to be tested.

2. A method for calibrating an analog signal integrator for use in calibrating a digital-to-analog converter according to claim 1, comprising the step of applying a known fixed analog standard signal to the input of said multiplier;
multiplying said fixed analog standard by a signal consisting of a selected orthogonal function; and
integrating the signal so multiplied over the duration of the orthogonal function signal to produce an output value characterizing said integrator relative to said calibration standard signal.

3. A method for testing an analog-to-digital converter comprising the steps of:
(a) generating a signal consisting of a set of orthogonal digital functions over a defined interval, said signal having its amplitude substanitally uniformly distributed among allowable states to approximate a maximum entropy sequence signal;
(b) applying each orthogonal function to a different input of a digital-to-analog converter of a known calibration transfer characteristic to generate an excitation signal at the output of said calibrated digital-to-analog converter which varies according to the binary weighting induced by said orthogonal functions;

(c) applying said excitation signal to an analog-to-digital converter under test in order to generate a digital output response signal at the output of said converter under test;

(d) characterizing said excitation signal and said digital output response signal each as a sum of known time dependent orthogonal functions having constant amplitude coefficients;

(e) identifying the amplitude coefficients of each of said functions; and (f) comparing the digital output response signal with said excitation signal to produce indices of deviation from an expected response.

4. The method according to claim 3 further including the step of adding the output signal of said digital-to-analog converter to the output signal of a dither signal generator to produce an excitation signal having an enhanced amplitude distribution.

5. The method according to claim 3 wherein said output response signal is characterized as:

$$z(t) = a \sum_{n=0}^{2^M-1} \gamma_n \Psi_n(t)$$

$$= y(t) + \epsilon(t)$$

where a is the gain of the analog to digital converter;
n is the index;
M is the order of the orthogonal function set;
y(t) is the excitation signal which is characterized as:

$$y(t) = \sum_{n=0}^{2^M-1} \alpha_n \Psi_n(t);$$

$\alpha_n$ is the known $n^{th}$ coefficient of the $n^{th}$ order orthogonal function of the set;
$\gamma_n$ is the measured $n^{th}$ coefficient of the $n^{th}$ order orthogonal function of the set; and
$\epsilon(t)$ is the error introduced by the analog to digital converter, further comprising the steps of processing the measured and known coefficients according to the following function;

$$\epsilon(t) = a \sum_{n=0}^{2^M-1} \gamma_n \Psi_n(t) - y(t)$$

to determine the error $\epsilon(t)$ introduced by the analog to digital converter.

6. The method according to claim 5 further comprising the steps of processing the known coefficients and the measured coefficients of the response according to the following function:

$$\overline{\epsilon^2}(t) = \frac{1}{T} \int T \left( a \sum_{n=0}^{2^M-1} \gamma_n \Psi_n(t) - y(t) \right)^2 dt$$

where T is the period to determine the mean squared error $\overline{\epsilon^2}(t)$ of the analog to digital converter.

7. The method according to claim 6 further comprising the steps of processing the known coefficients and the measured coefficients of the response according to the following function:

$$a_{opt} = \frac{\sum_{n=0}^{2^M-1} (\alpha_n + \beta_n)\gamma_n}{\sum_{n=0}^{2^M-1} \gamma_n^2}$$

to determine the gain $a_{opt}$ that minimizes the mean square error.

8. The method according to claim 7 further comprising the steps of processing the known coefficients and the measured coefficients of the response according to the following function:

$$\epsilon_l = \sum_{m=0}^{M-1} (a_{opt} \gamma_{k,m} - 2^m)\Phi_{2m}(t) - \epsilon'_l$$

where $\gamma_{k,m}$ is the $k^{th}$ order binary weighted orthogonal function coefficient associated with the $m^{th}$ bit of the calibrated converter output;
$\epsilon'_l$ is the known linearity error of the calibrated converter; and
$\phi_{2m}(t)$ is the $2^{m\ th}$ order modified orthoganol function or $\phi_m(t) = \frac{1}{2}[\Psi_o(t) + \Psi_{2m}(t)]$ to determine linearity error $\epsilon_l$ of the converter under test.

9. The method according to claim 8 further comprising the steps of processing said known coefficient and measured coefficients of the response according to the following functions:

$$\overline{\epsilon} = a\gamma_o - \frac{a}{2} \sum_{m=0}^{M-1} \alpha_{k,m} 2^m \Phi_n(t) - \overline{\epsilon'}$$

where $\overline{\epsilon'}$ is the known mean input offset linearity error of the calibrated converter; and
$\phi_n(t)$ is the $n^{th}$ order modified orthogonal function to determine the mean offset error of the converter under test.

10. The method according to claims 3, 5, 6, 7, 8 or 9 wherein said signal consisting of a set of orthogonal digital functions comprises a set of sampled two state orthogonal functions.

11. The method according to claim 10 wherein said sampled two state orthogonal functions are Walsh functions.

12. The method according to claim 11 wherein said bit examining step comprises:
processing said output response signals by means of a Fast Walsh Transform; and
comparing the digital output response signal with said excitation signal to determine at least the error introduced by said digital-to-analog converter, the mean square error, and the optimum gain of said analog-to-digital converter.

13. A method for testing a digital-to-analog converter comprising the steps of:

(a) generating a digital excitation signal consisting of a set of orthogonal functions having a known substantially uniform amplitude probability density function among allowable states for exciting substantially all allowable states of a digital to analog converter to which said generated digital signal is applied;

(b) applying said digital excitation signal to a digital-to-analog converter to be tested to produce an analog output response signal;

(c) applying said analog output response signal to a calibrated analog-to-digital converter in order to produce a digital processing signal at the output thereof; and (d) examining the digital processing signal produced by said analog-to-digital converter by multiplying and accumulating the digital excitation signal in order to determine deviation of the digital processing signal from a computed standard based on said digital excitation signal.

14. An apparatus for testing either a digital-to-analog converter or an analog-to-digital converter wherein one or the other converter is calibrated from which a known response is defined, comprising:

means for generating a digital excitation signal consisting of a set of orthogonal functions, the signal having a known substantially uniform amplitude probability density function among allowable states;

a digital-to-analog converter coupled to receive said excitation signal as a set of orthogonal functions, each function being applied at one bit input of said digital-to-analog converter to generate an analog response signal;

an analog-to-digital converter coupled to receive said response signal to generate a digital response signal; and means for multiplying and accumulating the digital response signal with each of the orthogonal functions in order to determine deviation of the digital response signal from a computed standard based on said digital excitation signal.

15. A method for testing an analog-to-digital converter comprising the steps of:

(a) generating a signal consisting of a set of orthogonal digital vectors over a defined interval, each orthogonal digital vector having a plurality of points, each point being characterized by amplitude and time, said signal comprising the sum of all orthogonal vectors and the signal having its amplitude substantially uniformly distributed among all allowable states to approximate a maximum entropy sequence signal;

(b) applying each orthogonal digital vector to a different input of a digital-to-analog converter having a known calibrated transfer characteristic to generate an excitation signal at the output of said calibrated digital-to-analog converter which varies according to the binary weighting induced by all the orthogonal digital vectors;

(c) applying said excitation signal to an analog-to-digital converter under test in order to generate a composite digital output response signal at the output of said converter under test; and (d) examining the composite digital output signal produced by said analog-to-digital converter under test by transforming the composite digital output signal into a set of orthogonal basis functions that correspond to the input orthogonal functions and comparing the corresponding coefficients in order to determine deviation of the output signal so produced from a computed standard based on said excitation signal.

16. An apparatus for testing a digital-to-analog converter comprising:

means for generating a digital excitation signal consisting of a set of binary weighted orthogonal functions, the signal having its amplitude uniformly distributed among allowable states to approximate a maximum entropy sequence signal;

means for coupling a digital-to-analog converter to be tested to receive the digital excitation signal;

means coupled to receive the analog output of the digital-to-analog converter to be tested for multiplying the analog output by an orthogonal functions and producing a multiplied signal; and means coupled to receive the multiplied signal for integrating the multiplied signal for the duration of the orthogonal function duration to produce a signal corresponding to an estimate of the dynamic weight of each selected bit of the digital-to-analog converter to be tested.

17. An apparatus for testing a digital-to-analog converter comprising:

means for generating a digital excitation signal consisting of a set of binary weighted orthogonal functions, the signal having its amplitude uniformly distributed among allowable states to approximate a maximum entropy sequence signal;

means for coupling a digital-to-analog converter to be tested to receive the digital excitation signal;

a calibrated analog-to-digital converter for producing a digital processing signal in response to receiving an analog signal;

means for coupling the output of the digital-to-analog converter to be tested to the input of the calibrated analog-to-digital converter; and means coupled to receive the digital processing signal and the digital excitation signal for multiplying and accumulating the digital processing signal with each of the orthogonal functions of the digital excitation signal.

18. Apparatus for testing an analog-to-digital converter comprising:

means for generating a digital excitation signal consisting of a set of orthogonal digital functions over a defined interval, said signal having its amplitude substantially uniformly distributed among allowable states to approximate a maximum entropy sequence signal;

a digital-to-analog converter having a known calibration transfer characteristic coupled to receive the digital excitation signal for generating an analog excitation signal at its output which varies according to the binary weighting induced by said orthogonal digital functions;

means coupled to the digital-to-analog converter for applying the analog excitation signal to an analog-to-digital converter to be tested;

a transform processor having an input for identifying amplitude coefficients of an applied digital signal comprised of known time dependent orthogonal functions having constant amplitude coefficients, identifying the amplitude coefficients of each of the functions and comparing an applied digital signal with the digital excitation signal to produce indices of deviation from an expected response; and means coupled to the transform processor for coupling the output of an analog-to-digital converter to be tested to the input of the transform processor.

19. Apparatus as in claim 18 comprising: a dither signal generator coupled to the digital-to-analog converter to produce a digital excitation signal having an enhanced amplitude distribution.

20. Apparatus as in claim 18 wherein means for generating a digital excitation signal generates a set of sampled two state orthogonal functions.

* * * * *